United States Patent
Swinford et al.

(10) Patent No.: US 9,679,742 B2
(45) Date of Patent: Jun. 13, 2017

(54) METHOD FOR OPTIMIZING CHARGED PARTICLE BEAMS FORMED BY SHAPED APERTURES

(71) Applicant: FEI Company, Hillsboro, OR (US)

(72) Inventors: Richard Swinford, Portland, OR (US); Mostafa Maazouz, Hillsboro, OR (US); David William Tuggle, Portland, OR (US); William M. Steinhardt, Durham, NC (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 14/981,164

(22) Filed: Dec. 28, 2015

(65) Prior Publication Data
US 2017/0125207 A1    May 4, 2017

Related U.S. Application Data

(60) Provisional application No. 62/249,012, filed on Oct. 30, 2015.

(51) Int. Cl.
*H01J 37/10* (2006.01)
*H01J 37/21* (2006.01)

(52) U.S. Cl.
CPC .............. *H01J 37/21* (2013.01); *H01J 37/10* (2013.01); *H01J 2237/317* (2013.01)

(58) Field of Classification Search
CPC ....... H01J 37/10; H01J 37/21; H01J 2237/317
See application file for complete search history.

(56) References Cited

U.S. PATENT DOCUMENTS

| | | | | |
|---|---|---|---|---|
| 5,304,811 | A * | 4/1994 | Yamada | B82Y 10/00 250/398 |
| 5,435,850 | A | 7/1995 | Rasmussen | |
| 5,834,783 | A * | 11/1998 | Muraki | B82Y 10/00 250/396 R |
| 5,851,413 | A | 12/1998 | Casella et al. | |
| 6,949,756 | B2 | 9/2005 | Gerlach et al. | |
| 6,977,386 | B2 | 12/2005 | Gerlach et al. | |
| 7,777,204 | B2 * | 8/2010 | Lapanik | B82Y 10/00 250/492.22 |

(Continued)

*Primary Examiner* — Nicole Ippolito
*Assistant Examiner* — Sean Luck
(74) *Attorney, Agent, or Firm* — Scheinberg & Associates, P.C.; Michael O. Scheinberg

(57) ABSTRACT

The present invention provides a method for optimizing a shaped working beam having a sharp edge for making sufficiently precise cuts and a high beam current for faster processing. An ion beam is directed along an optical column through a reference aperture to form a reference beam that has a preferred shape and an associated reference current. The reference beam is optimized using selected parameters of the optical components within the optical column. The ion beam is then directed through a working aperture to form a working beam for use in a processing application. The working beam has a different shape from the reference beam and an associated working current that is higher than the reference current. The reference aperture and working aperture have at least one corresponding dimension. The working beam is then optimized using the selected optical component parameters used to align and focus the reference beam.

16 Claims, 6 Drawing Sheets

(56) References Cited

U.S. PATENT DOCUMENTS

| | | | |
|---|---|---|---|
| 2002/0140383 A1* | 10/2002 | Ogasawara | B82Y 10/00 315/364 |
| 2004/0140438 A1 | 7/2004 | Gerlach et al. | |
| 2010/0058282 A1* | 3/2010 | Fujimura | B82Y 10/00 716/55 |
| 2010/0062349 A1* | 3/2010 | Fujimura | B82Y 10/00 430/5 |
| 2011/0084207 A1 | 4/2011 | Zhang et al. | |
| 2012/0217152 A1 | 8/2012 | Miller | |
| 2012/0221985 A1* | 8/2012 | Fujimura | G03F 1/20 716/55 |
| 2013/0181140 A1 | 7/2013 | Parker et al. | |
| 2013/0205264 A1* | 8/2013 | Fujimura | G03F 1/36 716/53 |
| 2013/0334442 A1* | 12/2013 | Kamikubo | H01J 37/3002 250/492.3 |
| 2014/0353526 A1* | 12/2014 | Fujimura | H01J 37/3177 250/492.21 |
| 2016/0199878 A1 | 7/2016 | Vystavel et al. | |

* cited by examiner

METHOD FOR OPTIMIZING CHARGED PARTICLE BEAMS FORMED BY SHAPED APERTURES

RELATED APPLICATIONS

This application claims priority from U.S. Provisional Patent Application No. 62/249,012, filed Oct. 30, 2015.

TECHNICAL FIELD OF THE INVENTION

The present invention relates to a method of optimizing a shaped beam, such as an electron beam, ion beam, or laser beam, for precision milling applications.

BACKGROUND OF THE INVENTION

Charged particle beams, laser beams, and neutral particle beams are used in a variety of microfabrication applications, such as fabrication of semiconductor circuitry and micro-electromechanical assemblies. The term "microfabrication" is used to include creating and altering structures having dimensions of tens of microns or less, including nanofabrication processes. "Processing" a sample refers to the microfabrication of structures on that sample. In charged particle beam systems, such as electron microscopes or focused ion beam (FIB) systems, a source generates charged particles which are then focused by an optical column into a beam and directed onto the surface of a target to be imaged and/or processed. In the column, this beam may be deflected to move it around on the target surface. As smaller and smaller structures are fabricated, it is necessary to direct the beam more precisely.

One aspect of semiconductor manufacturing that requires accurate beam positioning is the extraction of thin samples for transmission electron microscopy. Such samples are used for monitoring the semiconductor fabrication process. In some applications known as slice and view applications a "slice" or thin, vertical sample, referred to as a lamella, is milled out of the surface of a work piece. The lamella is extracted to leave an exposed cross-sectional surface to be imaged, for example, by a transmission electron microscope ("TEM"). In order to obtain a cross-sectional surface that is as flat and vertical as possible a clean, fine cut from the beam is required.

Typically, a beam controller directs the beam to specified coordinates or along a specified path using a beam controller coordinate system in response to a stored program, pattern generator, or operator instructions to perform a specific process. Ideally, the beam converges in the plane of the work piece or target specimen. However, if the system is not calibrated, the beam may converge before or after the sample plane causing the beam to be unfocussed. Also, the beam may exhibit stigmatic effects. Moreover, there may be rotational misalignment between the axis of the specimen and the scan axis of the beam. Or there may exist a non-orthogonal relationship between the beam axes. Further, the scan gain may be different in each of the orthogonal scan directions so that in one direction the image appears "stretched". The scanned beam system must therefore be calibrated to eliminate or at least minimize these errors. To overcome these problems a beam system will typically provide control elements to achieve calibration. For example, an electrostatic lens system may be provided to cause the beam to converge at the correct focal point and a stigmator may be provided to adjust for stigmation effects.

For precision processing in which a charged particle beam is used to mill material from the surface of a target the milling rate is roughly proportional to the beam current. For example, higher beam currents are preferred when it is desired to quickly remove material. However, beams using higher current are less precise and typically result in a damaged or undesirable sample. Therefore, lower beam currents have been used for more precision processing applications. A beam having a lower beam current, that is, fewer charged particles per second, can typically be focused to a smaller size than a beam having a higher current. For example, a small beam with a lower current is more precise and results in less unwanted damage to the sample. See, for example, U.S. Pat. No. 6,949,756, entitled "Shaped And Low Density Focused Ion Beams" to Gerlach et al., assigned to the assignee of the present invention, which is hereby incorporated by reference. However, use of lower current beams reduces the rate of material removal and results in a longer processing time.

It is increasingly more desirable to decrease processing time. Non-round or "shaped" beams have been developed in order to increase milling speed. Shaped beams can be generated having a straight edge for cutting away material, and at the same time, having their beam spot shapes of a size with enough beam current for quickly removing material. See, for example, U.S. Pat. No. 6,977,386, entitled "Angular Aperture Shaped Beam System And Method" to Gerlach et al., assigned to the assignee of the present invention, which is hereby incorporated by reference.

In some systems the beam is shaped by an aperture plate positioned within the optical column having one or more selectable beam-defining apertures (BDAs) through which the beam passes. The BDAs are typically holes in a metal strip, which are intended to block the off-axis charged particles and to pass the ones used to form the beam. There are typically several BDAs, or holes, in a metal strip, and the apertures can be switched depending on the application by moving the strip so that a hole of a different size and/or shape is positioned in the path of the beam. For example, a beam having a desired geometrically shaped spot is formed by a shaping aperture typically disposed between one or more lenses in a charged particle column. To achieve calibration, control elements may include a two-lens focusing column in which the first lens forms an image of the beam at or near the plane of the second lens and the second lens forms an image of the shaping aperture on the target plane. The lenses and other "optical" elements (i.e., a stigmator) in the beam column may use electrostatic or magnetic fields to align the beam along the optical axis and focus the beam on the target plane.

It is important for the beam to be accurately focused and compensated for aberrations. Typically, a beam is focused and aligned using known values for the optical elements such as the lenses and stigmator from a table of values that have been input and stored in a program or through operator instructions based on desired current. For example, FIGS. 1A and 1B show spot burn arrays for a 130 pA round beam. FIG. 1A shows a spot burn array 100 where the second lens focus was varied in a serpentine fashion from top to bottom and left to right. The beam was optimized using an image sharpness routine based on auto focus so that the center spot 102 is near optimal. FIG. 1B shows a spot burn array 104 where the stigmation was varied along X and Y directions. The beam was optimized using an image sharpness routine based on stigmation so that the center spot 106 is near optimal.

However, it is difficult to predict the optimal focus and stigmator settings for shaped beams as illustrated in FIGS. 2A and 2B, which show spot burn arrays for a 420 pA shaped beam formed with an elliptical aperture. FIG. 2A shows a spot burn array 108 where the second lens focus was varied in a serpentine fashion from top to bottom and from left to right. The beam was optimized using an image sharpness routine based on auto focus on its corresponding round beam so that the center spot 110 is near optimal. FIG. 2B shows a spot burn array 112 where the stigmation was varied along X and Y directions. The beam was optimized using an image sharpness routine based on stigmation on its corresponding round beam so that the center spot 114 is near optimal. However, as can be seen in FIGS. 2A and 2B the optimal spots 110, 114 are not elliptical but are more flat. This is because the auto focus/stigmation routines applied to elliptical beams (or other shaped beams) will typically seek out the roundest beam. However, the roundest-shaped elliptical beam is sub-optimal for milling.

What is needed is a method and system for optimizing a shaped beam having a sharp edge to achieve clean and fine milling operations while having a high current for rapid processing.

SUMMARY OF THE INVENTION

The present invention provides a method for optimizing a shaped beam having a sharp edge for making sufficiently precise cuts and a high beam current for faster processing. An ion beam is directed along an optical column through a reference aperture to form a reference beam that has a preferred shape and an associated reference current. The reference beam is aligned with the axis of the optical column and focused onto a target plane using selected parameters of the optical components within the optical column so that the reference beam has a profile with a sharp edge. The ion beam is then directed through a working aperture to form a working beam for use in a processing application. The working beam has a different shape from the reference beam and an associated working current that is higher than the reference current. The working beam is aligned with the axis of the optical column and focused onto the target plane using the selected optical component parameters used to align and focus the reference beam. This produces a working beam that has a profile with at least one sharp edge that substantially corresponds to the sharp edge produced by the reference beam but has a higher current. The reference aperture and working aperture have at least one corresponding dimension that produces the sharp edge. In a preferred embodiment, the reference aperture is round and has a diameter that extends along an axis. The working aperture has a shape with a minor diameter, such as an ellipse, that extends along an axis with the same alignment as the reference aperture axis. Preferably, the diameter of the reference aperture is substantially similar to the minor diameter of the working aperture to produce a working beam that has a sharp edge corresponding to the sharp edge of the reference beam but the shape of the working aperture produces a beam with a higher current.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

In accordance with preferred embodiments of the present invention, an ion optical column in a focused ion beam system produces a shaped beam having one or more geometric features having a sharp resolution that is focused and aligned with the axis of the optical column.

Figure 1A:
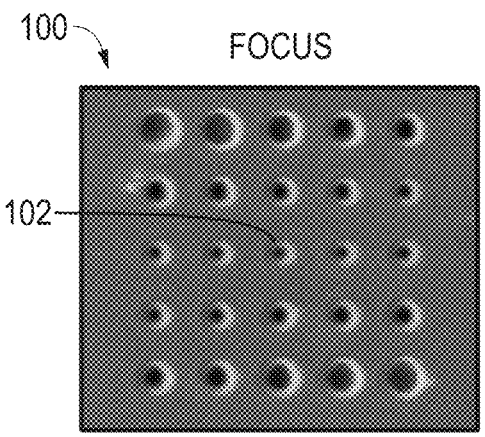
FIG. 1A shows a spot burn array for a round beam with a varied second lens focus.
Figure 1B:
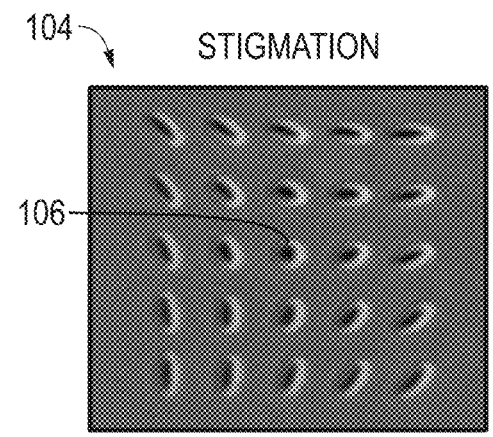
FIG. 1B shows a spot burn array for a round beam with varied stigmation along X and Y directions.
Figure 2A:
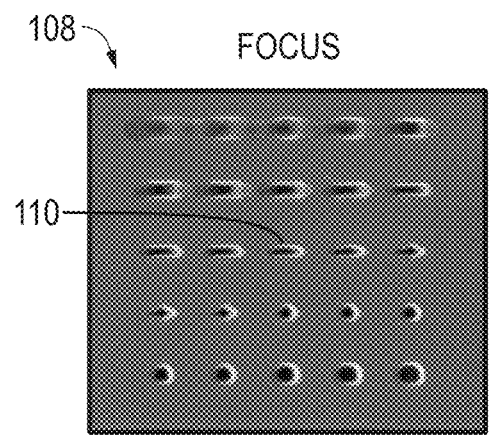
FIG. 2A shows a spot burn array for a beam formed using an elliptical aperture with a varied second lens focus.
Figure 2B:
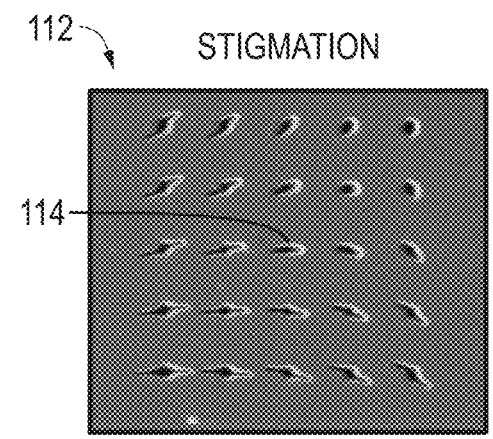
FIG. 2B shows a spot burn array for a beam formed using an elliptical aperture with varied stigmation along X and Y directions.
Figure 3:
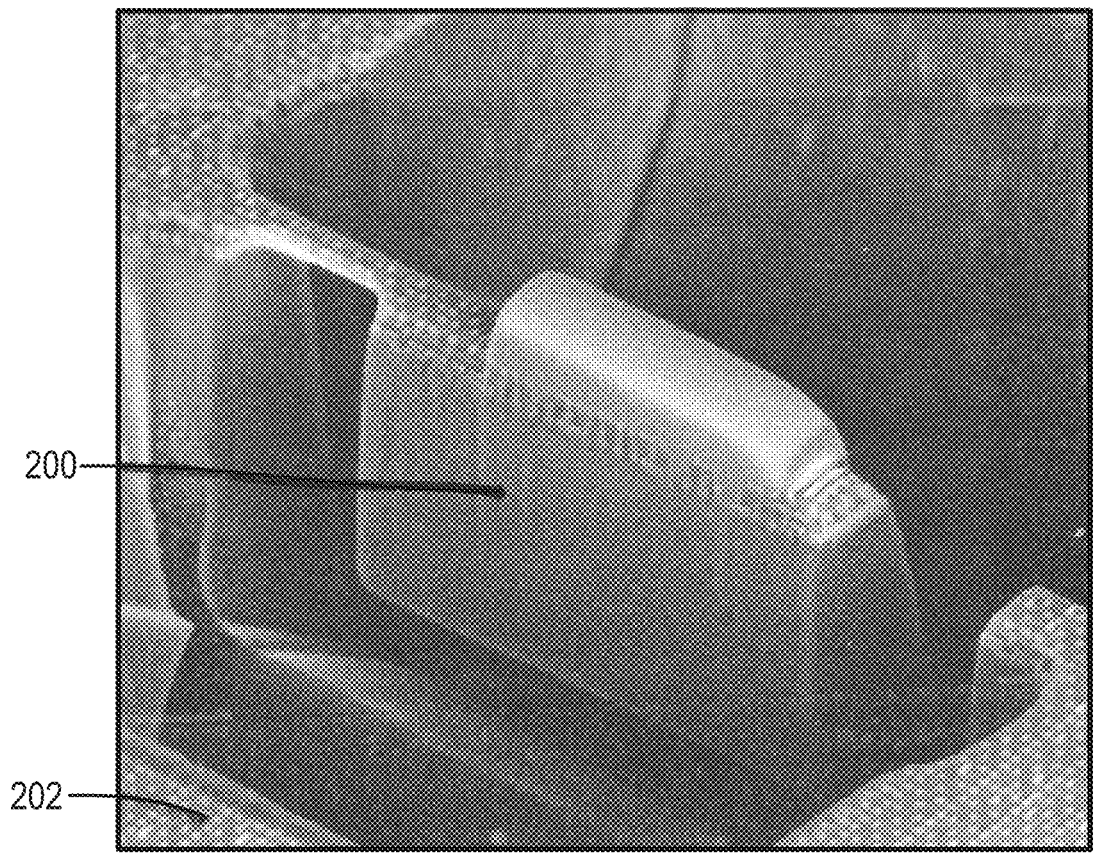
FIG. 3 shows an image of a lamella that has been milled from a substrate.

Microstructure milling tasks such as cross-sectional cutting for imaging, for example, require beams with at least one sharp edge for cutting away a slice that leaves a straight, "clean" cross-sectional surface. The beam spot has a leading edge, which is a sharp edge of the spot that can be used to mill away sharp, vertical faces. The beam spot also has width and depth dimensions. Some applications may require a beam having a minimized depth or width to produce a sharp edge with a high current for faster milling. For example, FIG. 3 shows an image of a lamella 200 that has been milled out of a substrate 202. Lamella 200 is then extracted and prepared for imaging.

In a preferred system the beam is shaped by an aperture plate positioned within the optical column having one or more selectable beam-defining apertures (BDAs) through which the beam passes. The BDAs are typically holes in a metal strip, which are intended to block the off-axis charged particles and to pass the ones used to form the beam. There are typically several BDAs, or holes, in a metal strip, and the apertures can be switched depending on the application by moving the strip so that a hole of a different size and/or shape is positioned in the path of the beam. For example, a beam having a desired spot is formed by a shaping aperture typically disposed between one or more lenses in a charged particle column. To achieve calibration, control elements may include a two-lens focusing column in which the first lens forms an approximately collimated beam from the point source (liquid metal ion source or LMIS) and the second lens forms an image of the point source with the angular distribution shaped by the aperture. The lenses and other "optical" elements (i.e., a stigmator) in the beam column may use electrostatic or magnetic fields to align the beam along the optical axis and focus the beam on the target plane.

A preferred method of this invention provides a shaped working beam for processing a work piece having the cutting edge sharpness of a round beam but operates with more current than can be achieved with a round beam. Although the preferred embodiment of the invention is described using a round reference beam and an approximately elliptically shaped working beam, it should be understood that the method of this invention includes various beam shapes including but not limited to beams formed from apertures with round, elliptical, rectangular, semi-circular (D-shaped), or other shapes.

In lamellae milling it is typical to use a beam having a current of between about 40-90 pA to provide a beam having a sharp edge to make a clean cut and prevent damage to the lamella. Beams having current within this range are typically round. However, a higher beam current is desired to decrease processing time. Higher beam current can be achieved using a shaped (non-round) beam such as, for example, an elliptical beam. However, it is difficult to optimize (align and focus) shaped beams to have a sharp cutting edge. A preferred method of this invention provides a shaped beam having a high enough beam current for to achieve fast milling yet has a sharp cutting edge to make a clean cut.

Figure 4:
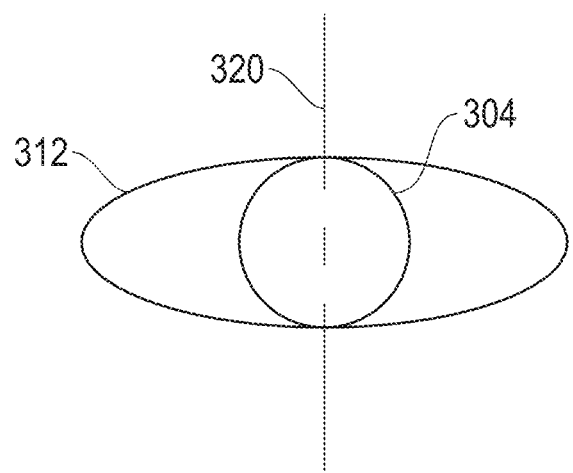
FIG. 4 shows the relationship of the reference beam aperture to the working beam aperture.
Figure 5:
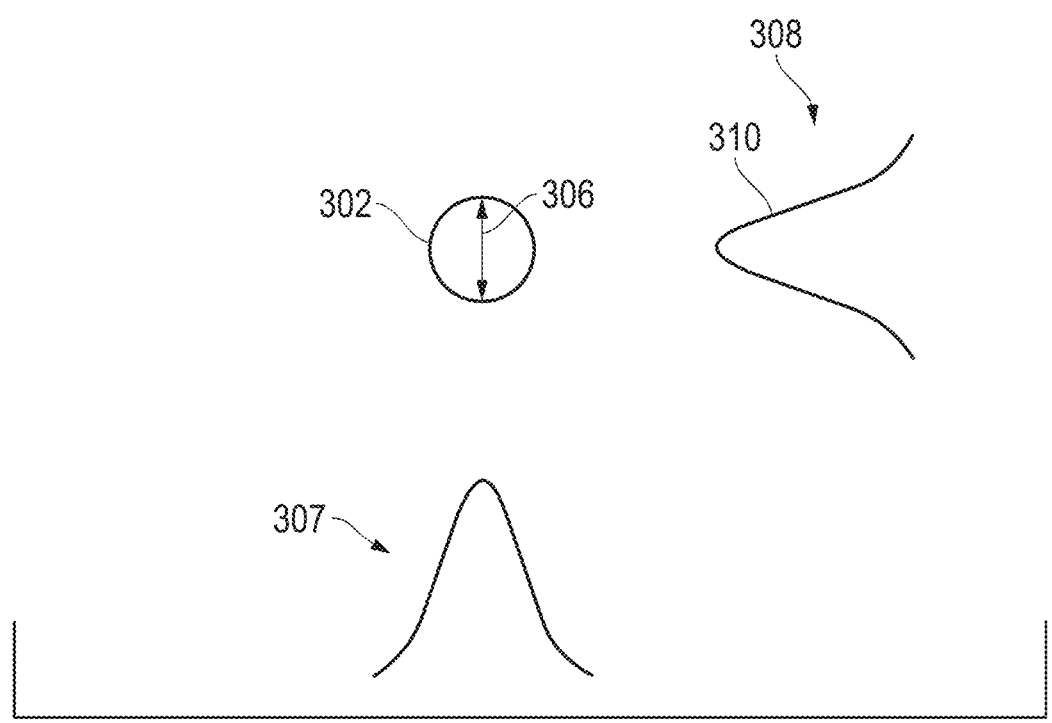
FIG. 5 shows the shape and corresponding beam profile of the reference beam.
Figure 6:
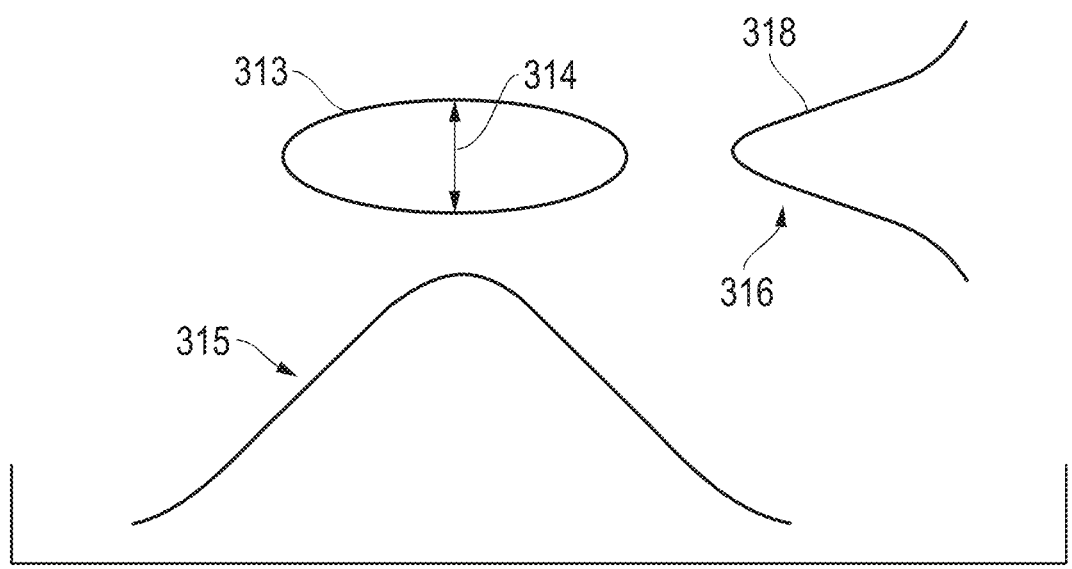
FIG. 6 illustrates the approximate shape and corresponding beam profile of the working beam.

In a preferred embodiment seen in FIGS. 4-6, a beam for cross-sectional slicing is provided by first forming a reference beam 302 (FIG. 5) through a reference aperture 304 (FIG. 4) having an associated reference current to have a round shape. In one example, the reference aperture may have a diameter of between 10 microns-1 mm and the reference current may be in the range of about 1-100000 pA. Reference beam 302 is optimized to be aligned with the axis of the optical column and focused onto a target plane (or work piece) using a set of selected settings or parameters of the optical components within the optical column. For example, parameters for the first and second lenses and the stigmator can be manipulated using known values to achieve desired optimization of the beam. The selected optical settings or parameters may vary depending on the application. As seen in FIG. 5, reference beam 302 has a dimension, such as diameter 306, that produces current density profiles 307 and 308 having a sharp edge 310 suitable for milling or cutting away a slice of a work piece.

To create a beam having a correspondingly sharp edge with a higher current for milling, the reference aperture 304 is moved so that the beam is then directed through a shaped elliptical working aperture 312 (FIG. 4) to form a working beam 313 (FIG. 6) having an approximately elliptical shape with an associated working current. Working beam 313 is optimized using the selected settings or parameters of the first and second lenses and stigmator that were used to optimize reference beam 302. Working beam 313 has a dimension, such as minor axis 314 that substantially corresponds to dimension 306 of reference beam 302 (as best seen in FIG. 4) so that when optimized produces a current density profiles 315 and 316 with a sharp edge 318 for milling the work piece. As seen in FIG. 4, during optimization, dimension 314 of working beam 313 is aligned along the location within the optical column of dimension 306 of reference beam 302 so that dimension 314 of working beam 313 and dimension 306 of reference beam 302 extend along an axis 320, which preferably extends substantially perpendicular to a work piece cutting face so that a leading edge or cutting edge 318 of the working beam cuts or mills the material. Thus, working beam 313 has a sharp cutting edge 318 to provide precision processing while operating with a high current so that faster milling operations can be achieved in less time than has been possible in prior art methods.

The size of the beam is dependent on the required beam current for a particular application. The diameter of the round reference beam will determine the minor axis of the shaped working beam aperture that is actually used in the slice milling. Therefore, a beam having a required specified current will result in a beam having a defined dimension. This will determine the minor axis of the shaped working beam aperture. The major axis of the shaped working beam aperture is also determined by beam current. For example, if the application requires a beam current that is twice that of the beam current used to form the round reference beam, the shaped working beam aperture is formed having a major axis that is twice that of the minor axis. Likewise, if the application requires a beam current that is three times that of the beam current used to form the round reference beam, the shaped working beam aperture is formed having a major axis that is three times that of the minor axis. This 3:1 ratio (major axis to minor axis) is generally applicable to beams up to about 750 pA. The major-to-minor axis ratio for shaped beam apertures with current higher than 750 pA is generally 2:1. That is, the major axis is twice that of the minor axis.

Although the preferred embodiment of the invention utilizes an elliptically shaped working beam apertures it is to be understood that the invention encompasses other non-round beam aperture shapes. For example, a rectangular beam apertures or other non-round shaped beam apertures may be used. It is also understood that these other non-round shaped beams are focused and aligned in the method described above in which a round reference beam is first optimized using selected optical component parameters and then the non-round shaped working beam is optimized using the selected optical component parameters used to align the round reference beam.

Figure 7:
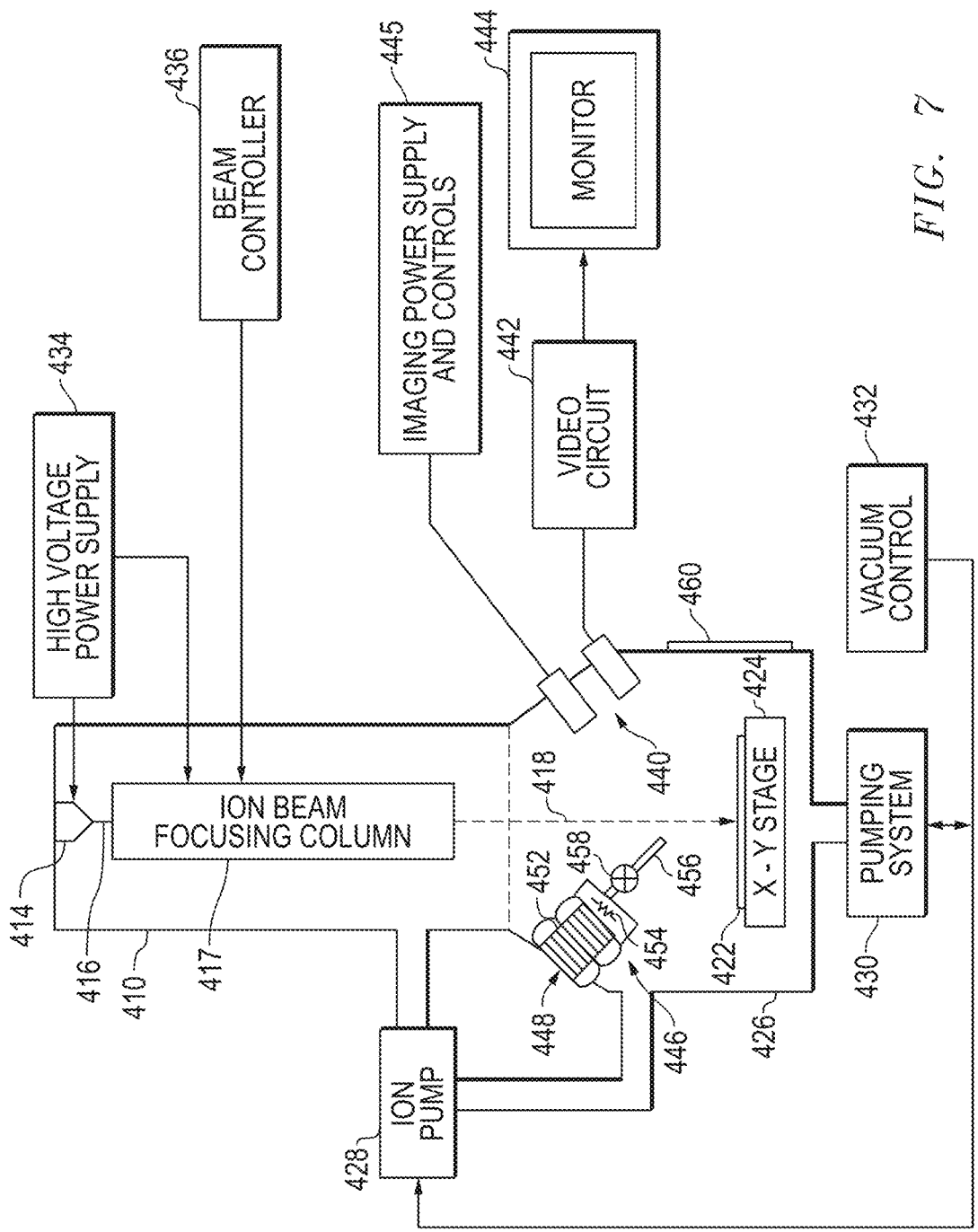
FIG. 7 shows a focused ion beam system in which a shaped beam according to this invention can be produced and optimized.

FIG. 7 schematically shows one embodiment of a shaped focused ion beam ("FIB") system suitable for use with the present invention. Note that the identified components are not required in all applications. Moreover, the depicted sizes and relative positions are not necessarily to scale or consistent with all configurations. Also, this system can be used either for a projection approach or for an angular aperture approach depending on the particular configuration of the optical components in the FIB column.

The depicted shaped beam system includes an evacuated chamber 410 having an ion source 414, such as a liquid metal ion source or a plasma microbeam ion source, and a focusing column 417, which includes an optical system such as is shown in the block diagram of FIG. 5 for defining a desired shaped ion beam 418 and focusing it onto a target work piece 422. (It should be recognized that the term "focus" is used broadly, refers generally to the re-directing of source ions into a beam directed to the target work piece, and covers shaped beams that are technically defocused with respect to a first-order focal plane.) Focusing column 417 uses a two-lens ion focusing structure for generating an aperture shaped beam. Skilled persons will understand that the lenses and other "optical" elements used with focused ion beams use electrostatic or magnetic fields to control ions in the beam, and that the optical elements are controlling a stream of ions. Also, the designs may include only one or up to several lenses. Moreover, while the principles of the specific aperture approach are discussed using this FIB system, they apply equally to other charged particle systems (such as e-beam systems) as long as suitable optical components for such other systems are used.

Unfocused ion beam 416 passes from source 414 through column 417 emitting a shaped beam 418 toward work piece 422, which is removably mounted on movable X-Y stage 424 within the lower portion of chamber 426. The work piece 422 can be any material that may be worked upon by beam 418 to achieve a desired result. It could comprise, for example, a semiconductor device, photo-lithographic mask, magnetic storage head, and the like. The particular shaped beam parameters being used will depend on the object material, we well as on the result that is desired. An ion pump 428 is employed for evacuating neck portion 410. The chamber 426 is evacuated with turbo-molecular and mechanical pumping system 430 under the control of vacuum controller 432.

High voltage power supply 434 is connected to liquid metal ion source 414, as well as to appropriate electrodes in focusing column 417 for forming an approximately 30 keV ion beam 418 and directing the same downwardly. Controller 436 is coupled to the focusing column 417 and in particular to deflection plates, a stigmator, and to a variable axis, variable shape aperture within the focusing column 417 in order to control beam 418, for example, to rotate, deform, and/or re-position it on the target work piece 422 in accordance with a desired task. (In some systems, the deflection plates, stigmator, and/or other optical devices are placed outside of the ion column after the final lens, as is well known in the art.) Through controller 436, a user can control beam 418 to be scanned in a desired manner through commands entered into a conventional user interface (not shown). Alternatively, controller 436 may access a memory storage device to upload instructions to cause the controller to control the system to scan a path, using a predefined beam shape.

The source 414 typically provides a metal ion beam of gallium from a field ion emission source (liquid metal ion source (LMIS)), although other ion sources, such as a multicusp or other plasma ion source, can be used. While this source is typically capable of being focused into a sub one-hundredth micron wide beam at the work piece 422. An electron multiplier 440 used for detecting secondary emission for imaging is connected to a power supply and controls 445 and to video circuit 442, which supplies drive for video monitor 444 for viewing work piece 422 as it is being worked upon.

A gas source 446 is located inwardly of the side of chamber 426 by translation device 448 adapted for positioning the source via support means within bellows 452. U.S. Pat. No. 5,435,850 to Rasmussen for a "Gas Injection System" and U.S. Pat. No. 5,851,413 to Casella, et al. for "Gas Delivery Systems for Particle Beam Processing," both assigned to the assignee of the present invention, discloses apparatuses for introducing and directing gaseous vapor toward the work piece 422. Gas source 446 includes a reservoir 454 with a heater, which may comprise a membrane type heater and can be used for raising the temperature of a compound within reservoir 454 to a temperature for providing a suitable stream of molecules for beam-induced reactions as hereinafter more fully disclosed. A transfer tube or nozzle 456 comprising a capillary tube provided by a hypodermic needle extends from reservoir 454 and is connected thereto via control valve 458 adapted for releasing gaseous vapor. The nozzle is extended and translated in orthogonal directions substantially perpendicular to its axis employing translation apparatus 448, so that gaseous vapor can be aimed directly toward a region on the top surface of the work piece 422.

A door 460 is opened for inserting a work piece 422 on stage 424 which may be heated. The door is interlocked so that it cannot be opened if the temperature in reservoir 454 is substantially above room temperature. A gate valve is closed before door 460 can be opened to seal off the ion source and focusing column apparatus.

When reservoir 454 is raised to a desired temperature for vaporizing the compound within reservoir 454, valve 458 may be opened by withdrawing an actuator rod from outside the apparatus to open and regulate the position of valve plunger, while the nozzle 456 is directed towards the desired area of the work piece. Bellows 452 accommodates movement of the nozzle assembly and reservoir relative to the work piece without affecting the vacuum with chamber 426.

The vacuum control system along with the heater of gaseous vapor source 446 are operated to provide an appropriate vapor pressure condition for establishing a gaseous vapor flux in chamber as directed toward substrate 422 for etching or depositing material. To establish a given gaseous flux, the reservoir is heated to a predetermined temperature.

The high voltage power supply 434 provides an appropriate acceleration voltage to electrodes in ion beam column 417 for energizing and focusing ion beam 418. When it strikes the work piece having condensed gaseous vapor adhered thereupon, the ion beam provides energy for initiating a reaction between the gaseous compound and the substrate and for either enhanced etching/milling of or material deposition upon the sample.

As mentioned earlier, the vacuum system provides a vacuum of between approximately $1 \times 10^{-7}$ Torr and $5 \times 10^{-4}$ Torr within chamber 426. With emission of gaseous vapor, the chamber background pressure is suitably about $1 \times 10^{-5}$ Torr. In an exemplary embodiment, the gaseous source 446 is heated to a temperature for providing an appropriate gaseous flux via the capillary tube of the hypodermic needle, while the metal ion source and focusing column are suitably controlled for generating a corresponding appropriate ion flux. Skilled persons can readily determine appropriate pressures and gas flows for any particular application.

A preferred embodiment of the invention provides a method for optimizing a shaped beam wherein ions are emitted from an ion source to form an ion beam extending through an optical column having optical components extending along an axis. The ion beam is directed through a reference aperture to form a reference beam having a reference beam shape and optimized onto a target plane using selected optical component parameters so that the reference beam is aligned with the axis of the optical column and focused to have a profile that produces a sharp edge resolution with an associated reference current. The ion beam is then directed through a working aperture to form a working beam for use in a processing application having a working beam shape and optimized onto the target plane using the selected optical component parameters for optimizing the reference beam so that the working beam is aligned with the axis of the optical column and focused to have a profile that produces a sharp edge resolution with an associated working current.

Preferably, the reference aperture is round and the working aperture is non-round and in a preferred embodiment the reference aperture is elliptical. The reference aperture has a diameter that corresponds to at least one dimension of the working aperture. Additionally, the working current is different from the reference current and is preferably higher. The optical components of a preferred embodiment include a first lens, a second lens, and a stigmator. Furthermore, the edge resolution of the working beam profile substantially corresponds to the edge resolution of the reference beam profile.

In another preferred embodiment of the invention, a method of processing a sample in a beam system is provided by directing a beam at a substantial normal angle to a surface of the sample and moving the beam along a path to produce a feature that is substantially normal to the surface of the sample. The beam is directed through an optical column having optical components extending along an axis. A reference aperture is provided through which the beam extends to form a reference-shaped beam and this beam is optimized onto a target plane using selected optical component parameters so that the reference-shaped beam is aligned with the axis of the optical column and focused to have a profile forming a sharp edge and having an associated reference current. A working aperture is provided through which the beam extends to form a working-shaped beam. The working-shaped beam is optimized onto the target plane with the selected optical component parameters used for optimizing the reference-shaped beam so that the working-shaped beam is aligned with the axis of the optical column and focused to have a profile forming a sharp edge and having an associated working current.

Preferably, the reference aperture is round and the working aperture is non-round and in a preferred embodiment the working aperture is elliptical. The reference aperture has a diameter that corresponds to at least one dimension of the working aperture and the working current is higher than the reference current. The selected set of optical component parameters is associated with a first lens, a second lens, and a stigmator.

A further preferred embodiment provides a beam system for producing a shaped beam including an ion source for producing a beam, an optical column including a first lens, a second lens, and a stigmator through which the beam extends, and an aperture plate positioned between the first and second lenses. The aperture plate has a reference-shaped aperture configured to form a reference beam with an associated current onto a plane of a sample and a working-shaped aperture configured to form a working beam with an associated current onto the plane of the sample. The reference beam edge sharpness has at least one dimension that corresponds to at least one dimension of the working beam edge sharpness.

In this preferred embodiment, the reference-shaped aperture is round and the working-shaped aperture is non-round and is preferably elliptical. The working beam has a current that is higher than the reference beam current.

An additional preferred embodiment provides a method for optimizing a shaped beam through an optical column having optical components, wherein an ion beam is directed through a first aperture to form a beam having a first beam shape and is optimized using selected parameters of the optical components. The first-shaped beam is then directed through a second aperture to form a beam having a second beam shape and is optimized using the selected parameters of the optical components. Preferably, the first aperture is round and the second aperture is elliptical.

The present invention will be discussed in the context of use in a focused ion beam system for demonstrative purposes. However, it will be understood that the methods of the present invention may also be employed in other scanned systems, such as electron beam systems including scanning electron microscopes and scanning transmission electron microscopes.

A preferred method or apparatus of the present invention has many novel aspects, and because the invention can be embodied in different methods or apparatus for different purposes, not every aspect need be present in every embodiment. Moreover, many of the aspects of the described embodiments may be separately patentable. The invention has broad applicability and can provide many benefits as described and shown in the examples above. The embodiments will vary greatly depending upon the specific application, and not every embodiment will provide all of the benefits and meet all of the objectives that are achievable by the invention.

It should be recognized that embodiments of the present invention can be implemented via computer hardware, a combination of both hardware and software, or by computer instructions stored in a non-transitory computer-readable memory. The methods can be implemented in computer programs using standard programming techniques—including a non-transitory computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a non-transitory storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of non-transitory computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

The invention could be used to prepare samples of any suitable material. The terms "work piece," "sample," "substrate," and "specimen" are used interchangeably in this application unless otherwise indicated. Further, whenever the terms "automatic," "automated," or similar terms are used herein, those terms will be understood to include manual initiation of the automatic or automated process or step.

In the following discussion and in the claims, the terms "including" and "comprising" are used in an open-ended fashion, and thus should be interpreted to mean "including, but not limited to . . . ." To the extent that any term is not specially defined in this specification, the intent is that the term is to be given its plain and ordinary meaning. The accompanying drawings are intended to aid in understanding the present invention and, unless otherwise indicated, are not drawn to scale. Particle beam systems suitable for carrying out the present invention are commercially available, for example, from FEI Company, the assignee of the present application.

Although the present invention and its advantages have been described in detail, it should be understood that various changes, substitutions and alterations can be made to the embodiments described herein without departing from the scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method for optimizing a shaped beam, comprising:
    emitting ions from an ion source to form an ion beam extending through an optical column having optical components extending along an axis;
    directing the ion beam through a reference aperture to form a reference beam having a reference beam shape;
    optimizing the reference beam onto a target plane using selected optical component parameters so that the reference beam is aligned with the axis of the optical column and focused to have a profile that produces a sharp edge resolution with an associated reference current;
    directing the ion beam through a working aperture to form a working beam for use in a processing application having a working beam shape; and
    optimizing the working beam onto the target plane using the selected optical component parameters for optimizing the reference beam so that the working beam is aligned with the axis of the optical column and focused to have a profile that produces a sharp edge resolution with an associated working current, wherein the working beam has a shape different from the shape of the reference beam and wherein the working current is greater than the reference current.

2. The method of claim 1, wherein the reference aperture is round and the working aperture is non-round.

3. The method of claim 2, wherein the working aperture is elliptical.

4. The method of claim 2, wherein the reference aperture has a diameter that corresponds to at least one dimension of the working aperture.

5. The method of claim 1, wherein the optical components include a first lens, a second lens, and a stigmator.

6. The method of claim 1, wherein the edge resolution of the working beam profile substantially corresponds to the edge resolution of the reference beam profile.

7. A method of processing a sample in a beam system by directing a beam at a substantial normal angle to a surface of the sample and moving the beam along a path to produce a feature that is substantially normal to the surface of the sample, comprising:
    directing the beam through an optical column having optical components extending along an axis;
    providing a reference aperture through which the beam extends to form a reference-shaped beam;
    optimizing the reference-shaped beam onto a target plane using selected optical component parameters so that the reference-shaped beam is aligned with the axis of the optical column and focused to have a profile forming a sharp edge and having an associated reference current;
    providing a working aperture through which the reference-shaped beam extends to form a working-shaped beam, the reference-shaped beam having a shape different from the shape of the working-shaped beam; and
    optimizing the working-shaped beam onto the target plane with the selected optical component parameters used for optimizing the reference-shaped beam so that the working-shaped beam is aligned with the axis of the optical column and focused to have a profile forming a sharp edge and having an associated working current that is greater than the reference current.

8. The method of claim 7, wherein the reference aperture is round and the working aperture is non-round.

9. The method of claim 8, wherein the working aperture is elliptical.

10. The method of claim 8, wherein the reference aperture has a diameter that corresponds to at least one dimension of the working aperture.

11. The method of claim 7, wherein the selected set of optical component parameters is associated with a first lens, a second lens, and a stigmator.

12. A beam system for producing a shaped beam, comprising:
    an ion source for producing a beam,
    an optical column including a first lens, a second lens, and a stigmator through which the beam extends, and
    an aperture plate positioned between the first and second lenses, the aperture plate having a reference-shaped aperture configured to form a reference beam with an associated current onto a plane of a sample and a working-shaped aperture configured to form a working beam with an associated current onto the plane of the sample, the current associated with the working beam greater than the current associated with the reference beam, wherein the working beam has a shape different from the shape of the reference beam, the reference beam has at least one dimension that corresponds to at least one dimension of the working beam.

13. The beam system of claim 12, wherein the reference-shaped aperture is round and the working-shaped aperture is non-round.

14. The beam system of claim 13, wherein the working-shaped aperture is elliptical.

15. A method for optimizing a shaped beam through an optical column having optical components, comprising:

directing an ion beam through a first aperture to form a beam having a first beam shape and a first beam current;

optimizing the first-shaped beam using selected parameters of the optical components;

directing the ion beam through a second aperture to form a beam having a second beam shape different from the first beam shape and a second beam current greater than the first beam current; and optimizing the second-shaped beam using the selected parameters of the optical components.

16. The method of claim 15, wherein the first aperture is round and the second aperture is elliptical.

* * * * *